United States Patent
Sun et al.

(10) Patent No.: US 10,121,717 B2
(45) Date of Patent: Nov. 6, 2018

(54) CARBON-COATED THERMAL CONDUCTIVE MATERIAL

(71) Applicant: SEKISUI CHEMICAL CO., LTD., Osaka (JP)

(72) Inventors: Ren-de Sun, Osaka (JP); Shoji Nozato, Osaka (JP); Akira Nakasuga, Osaka (JP); Masanori Nakamura, Kyoto (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 15/470,021

(22) Filed: Mar. 27, 2017

(65) Prior Publication Data

US 2017/0200663 A1    Jul. 13, 2017

Related U.S. Application Data

(63) Continuation of application No. PCT/JP2015/077329, filed on Sep. 28, 2015.

(30) Foreign Application Priority Data

Sep. 29, 2014 (JP) .................. 2014-199388
Sep. 29, 2014 (JP) .................. 2014-199389

(51) Int. Cl.
*H01L 23/29* (2006.01)
*B32B 9/00* (2006.01)
(Continued)

(52) U.S. Cl.
CPC ............ *H01L 23/29* (2013.01); *B32B 9/00* (2013.01); *B32B 15/04* (2013.01); *C01B 21/072* (2013.01);
(Continued)

(58) Field of Classification Search
CPC ... H01L 23/29; H01L 2223/58; H01L 23/295; C01B 21/072; B32B 15/04; B32B 9/00; C09K 5/14; F28F 13/18
(Continued)

(56) References Cited

U.S. PATENT DOCUMENTS

2005/0164090 A1    7/2005  Kim et al.
2009/0256457 A1*  10/2009  Tsukamoto ........... H01J 1/3046
                                                              313/6
(Continued)

FOREIGN PATENT DOCUMENTS

EP    3199494 A1    8/2017
EP    3203555 A1    8/2017
(Continued)

OTHER PUBLICATIONS

International Search Report issued in International Application No. PCT/JP2015/077329; dated Dec. 10, 2015 with English Translation (4 pages).
(Continued)

*Primary Examiner* — Vu A Vu
(74) *Attorney, Agent, or Firm* — Osha Liang LLP

(57) ABSTRACT

A carbon-coated thermal conductive material includes a coating layer comprising amorphous carbon on a surface of a thermal conductive material, wherein the thermal conductive material comprises a metal oxide, a metal nitride, a metal material, or a carbon-based material having a thermal conductivity of 10 W/mK or greater, the amorphous carbon is derived from carbon contained in an oxazine resin, a ratio of a peak intensity of a G band to a peak intensity of a D band is 1.0 or greater when the amorphous carbon is measured by Raman spectroscopy, an average film thickness
(Continued)

of the coating layer is 500 nm or less, and a coefficient of variation (CV value) of a film thickness of the coating layer is 15% or less.

15 Claims, 1 Drawing Sheet

(51) Int. Cl.
    *B32B 15/04* (2006.01)
    *C01B 21/072* (2006.01)
    *C09K 5/14* (2006.01)
    *F28F 13/18* (2006.01)

(52) U.S. Cl.
    CPC ............ *C01B 21/0728* (2013.01); *C09K 5/14* (2013.01); *H01L 23/295* (2013.01); *F28F 13/18* (2013.01); *H01L 2223/58* (2013.01)

(58) Field of Classification Search
    USPC ........................................................ 257/788
    See application file for complete search history.

(56) References Cited

U.S. PATENT DOCUMENTS

| | | | |
|---|---|---|---|
| 2011/0262740 A1* | 10/2011 | Martin, III | C23C 14/0647 428/332 |
| 2013/0071078 A1* | 3/2013 | Bennett | C03C 25/1065 385/123 |
| 2013/0136895 A1* | 5/2013 | Usui | C08J 5/18 428/141 |
| 2013/0192434 A1* | 8/2013 | Hashimoto | B29B 11/16 83/13 |
| 2014/0194018 A1* | 7/2014 | Nakamura | D06M 11/74 442/71 |

FOREIGN PATENT DOCUMENTS

| | | |
|---|---|---|
| JP | H07-33413 A | 2/1995 |
| JP | H07-188579 A | 7/1995 |
| JP | H09-31356 A | 2/1997 |
| JP | 2001-019546 A | 1/2001 |
| JP | 2001-089239 A | 4/2001 |
| JP | 2004-250281 | 9/2004 |
| JP | 2007-126755 A | 5/2007 |
| JP | 2009-134988 A | 6/2009 |
| JP | 2011-068757 A | 4/2011 |
| WO | 2013/027674 A1 | 2/2013 |
| WO | WO2013/027674 A1 * | 2/2013 .............. C08L 23/12 |

OTHER PUBLICATIONS

A. C. Ferrari et al. "Interpretation of Raman spectra of disordered and amorphous carbon", The American Physical Society, May 15, 2000, vol. 61, No. 20, pp. 14095-14107 (13 pages).

Extended European Search Report issued in European Application No. 15848051.7, dated Jun. 7, 2018 (9 pages).

* cited by examiner

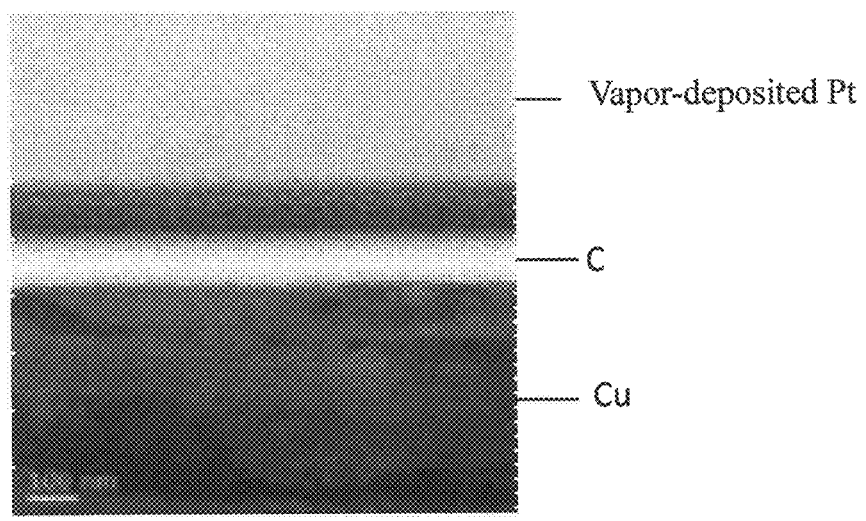

CARBON-COATED THERMAL CONDUCTIVE MATERIAL

TECHNICAL FIELD

One or more embodiments of the present invention relate to a carbon-coated thermal conductive material which can improve water resistance, oxidation resistance, and dispersibility at the time of being kneaded with a resin while maintaining excellent thermal conductive performance.

BACKGROUND

In the related art, as a filler of a semiconductor sealing resin, crystalline silica powder is frequently used.

Thermal conductivity of silica powder is poor. Therefore, it is difficult for the silica powder to counteract a trend in which an amount of heating of a semiconductor increases as the semiconductor becomes increasingly highly integrated and the electric power of the semiconductor is increased.

In recent years, power devices using wide band-gap semiconductors (SiC, GaN, and the like) have been frequently used, and the devices are heated at the time of operation. Therefore, in order to smoothly dissipate heat and to keep the semiconductor stably operating, an insulating filler having thermal conductivity better than those of silica is required.

For such an insulating filler, the use of alumina (thermal conductivity: 20 to 35 W/mK), boron nitride (30 to 50 W/mK), magnesium oxide (45 to 60 W/mK), aluminum nitride (180 to 270 W/mK), and the like have been examined. Among these, in view of stability, costs, and the like, alumina is the most frequently used currently.

However, even in a case where alumina is used, alumina is still insufficient for being used in a power device.

Although the use of boron nitride instead of alumina has been examined, boron nitride has crystalline anisotropy, and accordingly, a thermal conductivity of boron nitride in a direction perpendicular to a plane is low while an in-plane thermal conductivity thereof is high. Therefore, in a case where boron nitride is kneaded with a resin, thermal conductivity thereof is insufficient. Furthermore, the costs of boron nitride also tend to be high.

As materials having a thermal conductivity higher than that of alumina or boron nitride, there are magnesium oxide and aluminum nitride. Particularly, although the price of magnesium oxide is practically equivalent to that of alumina, a thermal conductivity thereof is not less than two times a thermal conductivity of alumina.

However, both of magnesium oxide and aluminum nitride are insufficiently resistant to water. Accordingly, magnesium oxide and aluminum nitride easily react with moisture in the air or in a resin, and thermal conductivity thereof markedly deteriorates after reaction.

Therefore, as a method for improving water resistance, a method of coating surfaces of particles is frequently used. For example, a method of coating particle surfaces with glass ($PbO-B_2O_3-SiO_2$) (PTL 1), a method of coating particle surfaces with a silane coupling agent (PTL 2), a method of coating particle surfaces with poorly soluble phosphate (PTL 3) or sulfate (PTL 4) or with carbon (PTL 5), and the like have been suggested.

However, all of the above methods require a high-temperature process for coating and a water resistance-improving effect thereof is insufficient.

Owing to its high thermal conductivity, a metal material such as copper is drawing attention as a high-efficiency heat radiation material. However, because such a metal is easily oxidized, thermal conductivity thereof easily deteriorates. Furthermore, metals cannot be used as an insulating thermal conductive filler because they are conductive materials. Therefore, a surface coating technique which can impart insulating properties while maintaining a high thermal conductivity of a metal is anticipated.

For example, PTL 6 suggests a method of coating surfaces of metal particles by carbonizing a thermoplastic resin such as polyvinyl chloride by heating. However, in this method, the resin needs to be fired at a high temperature (1,000° C. or higher) in an inert gas atmosphere, and the costs are high, and the productivity is poor. In addition, in the above method, an oxidation-reduction reaction between a resin and a metal oxide caused at a high temperature is used. Accordingly, depending on the type of metal, a large amount of impurities such as metal carbides is mixed in.

CITATION LIST

Patent Literature

[PTL 1] JP-A-7-188579
[PTL 2] JP-A-2011-68757
[PTL 3] JP-A-9-31356
[PTL 4] JP-A-7-33413
[PTL 5] JP-A-2004-250281
[PTL 6] JP-A-2007-126755

SUMMARY

One or more embodiments of the present invention have been made based on the current circumstances described above, and provide a carbon-coated thermal conductive material which can improve water resistance, oxidation resistance, and dispersibility at the time of being kneaded with a resin while maintaining excellent thermal conductive performance.

One or more embodiments of the present invention relate to a carbon-coated thermal conductive material having a coating layer composed of amorphous carbon on the surface of a thermal conductive material. In the carbon-coated thermal conductive material, the thermal conductive material is composed of a metal oxide, a metal nitride, a metal material, or a carbon-based material having a thermal conductivity of 10 W/mK or greater; the amorphous carbon is derived from carbon contained in an oxazine resin; in a case where the amorphous carbon is analyzed by Raman spectroscopy, a ratio of a peak intensity of a G band to a peak intensity of a D band is 1.0 or greater; an average film thickness of the coating layer is 500 nm or less; and a coefficient of variation (CV value) of a film thickness of the coating layer is 15% or less.

Hereinafter, one or more embodiments of the present invention will be specifically described.

As a result of conducting intensive examination, the inventors obtained knowledge that, by forming a coating layer, which is composed of carbon derived from a predetermined resin and has predetermined physical properties, on the surface of a thermal conductive material, it is possible to obtain a carbon-coated thermal conductive material which can improve water resistance while maintaining excellent thermal conductive performance.

The carbon-coated thermal conductive material according to one or more embodiments of the present invention has a coating layer composed of amorphous carbon on the surface of a thermal conductive material.

In one or more embodiments, a material constituting the thermal conductive material is a metal oxide, a metal nitride, a metal material, or a carbon-based material. Depending on the material of the thermal conductive material, in addition to the aforementioned excellent thermal conductive performance and the improvement of water resistance, the improvement of oxidation resistance can be achieved.

Examples of the aforementioned metal oxide include zinc oxide, alumina, magnesium oxide, and the like. Examples of the aforementioned metal nitride include boron nitride, aluminum nitride, silicon nitride, and the like. In one or more embodiments of the present invention, magnesium oxide and aluminum nitride may be used.

A metal constituting the aforementioned metal material may have a standard oxidation-reduction potential of +1.0 V to −2.5 V. Examples of such a metal include copper (0.340 V), nickel (−0.257 V), cobalt (−0.277 V), iron (−0.44 V), silver (0.799 V), titanium (−0.63 V), aluminum (−1.676 V), zinc (−0.763 V), tin (−0.138 V), magnesium (−2.356 V), an alloy of these, and the like. In one or more embodiments of the present invention, copper (Cu), nickel (Ni), iron (Fe), and cobalt (Co) may be used.

Particularly, owing to its high conductivity or high thermal conductivity, copper may be used in many industrial fields. However, copper is known to be easily oxidized and the performance thereof deteriorates due to oxidation. In a case where copper is in the form of fine particles (for example, nanoparticles), the performances thereof may markedly deteriorate due to oxidation, and hence the inhibition of oxidation of copper nanoparticles by means of surface coating is examined in many ways. In a case where copper is used in one or more embodiments of the present invention, the oxidation of copper can be more effectively inhibited. Although nickel, iron, and cobalt also have properties of being easily oxidized, in a case where these metals are used in one or more embodiments of the present invention, they can be suitably used as a magnetic material or the like.

Owing to its high thermal conductivity, copper is frequently used as a heat radiation material such as a heat sink of electronic parts. However, a heat dissipation member of electronic parts is required to have insulating properties in many cases. Because copper has conductivity, it cannot be used as an insulating heat radiation material. In contrast, because one or more embodiments of the present invention have the aforementioned coating layer, it is possible to maintain high thermal conductivity while imparting insulating properties to copper, and copper can be used as a heat radiation material having high insulating properties.

Examples of the aforementioned carbon-based material include graphite, carbon black, charcoal, activated carbon, and the like. Furthermore, it is possible to use a material such as Ketjen black (KB), to which high conductivity is imparted, or a functional carbon material such as carbon nanotubes or fullerene.

The carbon-based material does not include those composed of amorphous carbon.

The aforementioned thermal conductive material may have, for example, a particle shape, a flake shape, a fiber shape, a tube shape, a plate shape, a porous shape, and the like. The thermal conductive material may have a particle shape or a flake shape, and may have a spherical shape in one or more embodiments of the present invention.

Particularly, in a case where the thermal conductive material has a particle shape, the carbon-coated thermal conductive material according to one or more embodiments of the present invention can exhibit excellent dispersibility in a resin.

In a case where the thermal conductive material has a particle shape, an average particle size thereof may be 0.1 to 100 µm, for example, 0.5 to 80 µm, and 1.0 to 60 µm.

The thermal conductive material may have high crystallinity. The higher the crystallinity, the less the phonon scattering occurs in the particles, and hence a thermal conductivity increases. As an index of crystallinity, a degree of crystallization can be used. A lower limit of a degree of crystallization of the thermal conductive material may be 30%. When the degree of crystallization is less than 30%, the thermal conductivity may markedly deteriorate in some cases. The lower limit of the degree of crystallization may be 50% or 70%.

The degree of crystallization can be determined in a manner in which a scattering peak resulting from a crystalline portion that is detected by an X-ray diffractometry or the like and a halo resulting from a non-crystalline portion are separated from each other through fitting; an intensity integral of each portion is calculated; and a proportion of the crystalline portion in the entire material is calculated.

In one or more embodiments, the thermal conductive material has a thermal conductivity of 10 W/mK or greater.

In a case where the thermal conductivity is 10 W/mK or greater, when the thermal conductive material is used as a heat dissipation member, the generated heat can be efficiently dissipated out of an electronic part or a device. A lower limit of the thermal conductivity may be 20 W/mK.

The thermal conductivity can be measured using a method such as a steady state method or a non-steady state method.

The carbon-coated thermal conductive material according to one or more embodiments of the present invention has a coating layer composed of amorphous carbon. Because the carbon-coated thermal conductive material has the coating layer, it is possible to greatly improve water resistance while maintaining excellent thermal conductivity or electrical insulating properties. As a result, for example, in a case where the carbon-coated thermal conductive material is used as a filler of a semiconductor sealing resin or the like, the generated heat can be efficiently dissipated from a device. Accordingly, by inhibiting deterioration of the device resulting from heat accumulation, the carbon-coated thermal conductive material can make a contribution to high integration, increasing of electric power, and extension of service life of a semiconductor.

The aforementioned coating layer can be prepared through a simple process without requiring a high-temperature firing process.

The coating layer may be formed on at least a portion of the surface of the thermal conductive material, or may be formed such that the entire surface of the thermal conductive material is coated. The coating layer may be formed such that the entire surface of the thermal conductive material is coated, because then water resistance of the thermal conductive material can be further improved.

The coating layer may be a highly dense layer. In one or more embodiments of the present invention, in a case where a highly dense coating layer is formed, the contact between the thermal conductive material and moisture can be prevented, and the deterioration of thermal conductivity caused by water can be inhibited.

There is no strict definition of "denseness" of the dense coating layer. In one or more embodiments of the present invention, when each of nanoparticles is observed using a high-resolution transmission electron microscope, in a case where a coating layer on the particle surface is clearly observed as in FIG. 1, and the coating layer is found to be continuously formed, the coating layer is defined as being "dense".

In one or more embodiments, the amorphous carbon constituting the coating layer has an amorphous structure in which an sp2 bond is mixed with an sp3 bond, and is composed of carbon. In a case where the amorphous carbon is analyzed by Raman spectroscopy, a ratio of a peak intensity of a G band to a peak intensity of a D band is 1.0 or greater.

In a case where the amorphous carbon is analyzed by Raman spectroscopy, two peaks of a G band (at around 1,580 cm$^{-1}$) corresponding to the sp2 bond and a D band (at around 1,360 cm$^{-1}$) corresponding to the sp3 bond are clearly observed. In a case where a carbon material has crystallinity, any one of the above two bands is continuously minimized. For example, in a case of single-crystal diamond, a G band at around 1,580 cm$^{-1}$ is practically not observed. In contrast, in a case of a high-purity graphite structure, a D band at around 1,360 cm$^{-1}$ practically does not appear.

In one or more embodiments of the present invention, particularly, in a case where the ratio of a peak intensity of the G band to a peak intensity of the D band (peak intensity of G band/peak intensity of D band) is 1.0 or greater, denseness of the formed amorphous carbon film can be improved, and an effect of inhibiting sintering that occurs between particles at a high temperature becomes excellent.

In a case where the ratio of a peak intensity is less than 1.0, the film becomes hard, fine cracks easily occur in the film, and adhesiveness and strength of the film deteriorate.

The ratio of a peak intensity may be 1.2 to 10.

The aforementioned coating layer may contain an element other than carbon. Examples of the element other than carbon include nitrogen, hydrogen, oxygen, and the like. A content of the element may be 10 at % or less with respect to a total content of carbon and the element other than carbon.

In one or more embodiments, the amorphous carbon constituting the coating layer is derived from carbon contained in an oxazine resin, and the oxazine resin can be carbonized at a low temperature. Therefore, cost reduction can be accomplished.

In one or more embodiments, the oxazine resin is a resin that is generally classified into a phenol resin. The oxazine resin is a thermosetting resin obtained by adding amines to phenols and formaldehyde and causing a reaction. In a case where a type of phenol which may additionally have an amino group on a phenol ring, for example, a phenol such as para-aminophenol is used as the phenols, amines do not need to be added in the aforementioned reaction, and the resin tends to be easily carbonized. Regarding the ease of carbonization, the resin is more easily carbonized by the use of a naphthalene ring than by the use of a benzene ring.

The aforementioned oxazine resin includes a benzoxazine resin and a naphthoxazine resin. Between these, a naphthoxazine resin is suitable because this resin is easily carbonized at the lowest temperature. As a partial structure of the oxazine resin, a partial structure of a benzoxazine resin is shown in the following Formula (1), and a partial structure of a naphthoxazine resin is shown in the following Formula (2).

As shown in the following formulae, the oxazine resin refers to a resin having a 6-membered ring added to a benzene ring or a naphthalene ring. The 6-membered ring contains oxygen and nitrogen, and the name of the resin is derived from such a structure.

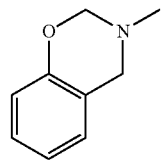

(1)

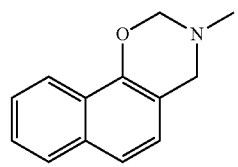

(2)

In a case where the oxazine resin is used, it is possible to obtain an amorphous carbon film at a temperature that is much lower than a temperature at which the amorphous carbon film is obtained using other resins such as an epoxy resin. Specifically, the oxazine resin can be carbonized at a temperature of 200° C. or lower. Particularly, in a case where a naphthoxazine resin is used, the resin can be carbonized at a lower temperature.

In this way, by carbonizing an oxazine resin at a lower temperature, a highly dense coating layer having amorphous carbon can be formed.

It is unclear why the highly dense coating layer having amorphous carbon is formed. Presumably, for example, in a case where a naphthoxazine resin is used as an oxazine resin, naphthalene structures in the resin may be locally linked to each other due to heating at a low temperature, a layered structure may be formed at a molecular level, and hence the aforementioned highly dense coating film may be formed. The layered structure is not treated at a high temperature and hence does not develop into a long-range periodic structure such as graphite. Therefore, the layered structure does not exhibit crystallinity.

Whether the obtained carbon has a graphite-like structure or an amorphous structure can be confirmed by checking whether or not a peak is detected at a position in which 2θ equals 26.4° by an X-ray diffractometry which will be described later.

As raw materials of the aforementioned naphthoxazine resin, dihydroxynaphthalene which is one of the phenols, formaldehyde, and amines are used. These will be specifically described later.

The aforementioned amorphous carbon may be obtained by performing a thermal treatment on the aforementioned oxazine resin at a temperature of 150° C. to 350° C. In one or more embodiments of the present invention, a naphthoxazine resin which can be carbonized at a low temperature is used, and accordingly, amorphous carbon can be obtained at a relatively low temperature.

Obtaining the amorphous carbon at a low temperature as described above brings an advantage that the amorphous carbon can be prepared by at lower costs through a simpler process as compared with the related art.

A temperature of the thermal treatment may be 170° C. to 300° C.

In one or more embodiments, an upper limit of an average film thickness of the aforementioned coating layer is 500 nm. In a case where the average film thickness of the coating layer is greater than 500 nm, the size of particles increases after coating, and thermal conductivity of the carbon-coated thermal conductive material prepared using the particles deteriorates. The upper limit of the average film thickness of the coating layer may be 400 nm. A lower limit of the average film thickness of the coating layer is not particularly limited, and may be 300 nm.

In one or more embodiments, a coefficient of variation (CV value) of a film thickness of the coating layer is 15% or less. In a case where the CV value of the film thickness of the coating layer is 15% or less, the film thickness of the coating layer becomes uniform and hardly shows a variation. Therefore, the coating layer can exhibit high barrier properties with respect to water vapor or oxygen. As a result, a thermal conductive material having high water resistance or oxidation resistance can be obtained. Furthermore, a uniform and dense coating film is obtained, and in a case where a metal is used, insulating properties can be imparted to the metal by using an extremely thin film. Consequently, the original thermal conductivity of the material is not greatly affected. An upper limit of the CV value of the film thickness of the coating layer may be 10%. A lower limit of the CV value is not particularly limited, and may be 0.5%.

In one or more embodiments, the CV value (%) of a film thickness is obtained by expressing a value, which is obtained by dividing a standard deviation by an average film thickness, as a percentage. The CV value is a numerical value determined by the following equation. The smaller the CV value, the smaller the variation of the film thickness.

$$CV \text{ value of film thickness (\%)} = (\text{standard deviation of film thickness/average film thickness}) \times 100$$

The average film thickness and the standard deviation can be measured using, for example, FE-TEM.

The aforementioned coating layer may exhibit excellent adhesiveness with respect to the thermal conductive material. Although there is no clear definition of adhesiveness, the coating layer may not be peeled off even if a mixture containing the carbon-coated thermal conductive material and a resin is treated with means for dispersion such as a bead mill.

In one or more embodiments of the present invention, in a case where the coating layer is measured by time-of-flight secondary ion mass spectrometry (TOF-SIMS), at least either a mass spectrum resulting from a benzene ring or a mass spectrum resulting from a naphthalene ring may be detected.

In a case where a mass spectrum resulting from a benzene ring or a naphthalene ring is detected as described above, the coating layer can be confirmed to be derived from carbon contained in an oxazine resin.

In one or more embodiments of the invention of the present application, the mass spectrum resulting from a benzene ring refers to a mass spectrum at around 77.12, and the mass spectrum resulting from a naphthalene ring refers to a mass spectrum at around 127.27.

The coating layer can be measured as above by using, for example, a TOF-SIMS device (manufactured by ION-TOF GmbH).

In one or more embodiments of the present invention, in a case where the coating layer is measured by X-ray diffractometry, a peak may not be detected at a position in which $2\theta$ equals 26.4°.

The peak in a position in which $2\theta$ is 26.4° is a peak of a graphite crystal. In a case where a peak is not detected at such a position, it can be mentioned that carbon forming the coating layer has an amorphous structure.

The coating layer can be measured as above by using, for example, an X-ray diffractometer (SmartLab Multipurpose, manufactured by Rigaku Corporation) or the like.

As a method for manufacturing the carbon-coated thermal conductive material according to one or more embodiments of the present invention, it is possible to use a method including a step of preparing a mixed solution containing formaldehyde, aliphatic amine, and dihydroxynaphthalene, a step of adding a thermal conductive material composed of a metal oxide or a metal nitride to the mixed solution and causing a reaction, and a step of performing a thermal treatment at a temperature of 150° C. to 350° C.

In the method for manufacturing the carbon-coated thermal conductive material according to one or more embodiments of the present invention, a step of preparing a mixed solution containing formaldehyde, aliphatic amine, and dihydroxynaphthalene is performed.

Because formaldehyde is unstable, formalin, which is a formaldehyde solution, may be used. Generally, formalin contains formaldehyde, water, and a small amount of methanol as a stabilizer. The formaldehyde used in one or more embodiments of the present invention may be formalin as long as the formalin contains a certain amount of formaldehyde.

Formaldehyde also includes paraformaldehyde as a type of polymer thereof. Although paraformaldehyde can be used as a raw material, formalin described above may be used because reactivity of paraformaldehyde is poor.

In one or more embodiments, the aforementioned aliphatic amine is represented by a formula R—$NH_2$, and P may be an alkyl group having 5 or less carbon atoms. Examples of the alkyl group having 5 or less carbon atoms include, but are not limited to, a methyl group, an ethyl group, a n-propyl group, an isopropyl group, a cyclopropyl group, a n-butyl group, an isobutyl group, a s-butyl group, a t-butyl group, a cyclobutyl group, a cyclopropylmethyl group, a n-pentyl group, a cyclopentyl group, a cyclopropylethyl group, and a cyclobutylmethyl group.

A molecular weight of the aliphatic amine may be reduced. Therefore, the substituent R may be a methyl group, an ethyl group, a propyl group, or the like. Aliphatic amine called methylamine, ethylamine, propylamine, and the like in actual compound names can be used. Among these, methylamine having the smallest molecular weight may be used in one or more embodiments of the present invention.

The aforementioned dihydroxynaphthalene includes many isomers, and examples thereof include 1,3-dihydroxynaphthalene, 1,5-dihydroxynaphthalene, 1,6-dihydroxynaphthalene, 1,7-dihydroxynaphthalene, 2,3-dihydroxynaphthalene, 2,6-dihydroxynaphthalene, and 2,7-dihydroxynapnthalene.

Among these, in view of high reactivity, 1,5-dihydroxynaphthalene and 2,6-dihydroxynaphthalene may be used in one or more embodiments of the present invention. In one or more embodiments, 1,5-dihydroxynaphthalene may be used because it is the most reactive.

Regarding a proportion of each of three components of dihydroxynaphthalene, aliphatic amine, and formaldehyde, in the aforementioned mixed solution, 1 mole of dihydroxynaphthalene, 1 mole of aliphatic amine, and 2 moles of formaldehyde may be formulated together.

Depending on the reaction conditions, the raw materials are lost during the reaction due to volatilization or the like, and accordingly, an optimal formulation ratio is not limited only to the above ratio. However, the raw materials may be formulated together at a formulation ratio of dihydroxynaphthalene:aliphatic amine:formaldehyde=1:0.8 to 1.2:1.6 to 2.4 in terms of mole.

In a case where the amount of the aliphatic amine is set to be 0.8 moles or greater, an oxazine ring can be sufficiently formed, and polymerization can suitably proceeds. In a case where the amount of the aliphatic amine is set to be 1.2 moles or less, formaldehyde necessary for the reaction is not excessively consumed. Therefore, the reaction smoothly proceeds, and naphthoxazine can be obtained as desired. Likewise, in a case where the amount of formaldehyde is set to be 1.6 moles or greater, an oxazine ring can be sufficiently formed, and polymerization can suitably proceeds.

Furthermore, the amount of formaldehyde may be set to be 2.4 moles or less, because then the occurrence of a side reaction can be reduced.

The aforementioned mixed solution may contain a solvent which is for dissolving and reacting the aforementioned 3 raw materials.

Examples of the solvent include solvents generally used for dissolving a resin, such as alcohols including methanol, ethanol, and isopropanol, tetrahydrofuran, dioxane, dimethylformamide, dimethylacetamide, dimethyl sulfoxide, and N-methylpyrrolidone.

An amount of the solvent added to the mixed solution is not particularly limited. In a case where the amount of the raw materials including dihydroxynaphthalene, aliphatic amine, and formaldehyde is regarded as being 100 parts by mass, the amount of the solvent formulated with the mixed solution may be 300 to 30,000 parts by mass in general. In a case where the amount of the solvent is set to be 300 parts by mass or greater, solutes can be thoroughly dissolved, and hence a uniform film can be formed. In a case where the amount of the solvent is set to be 30,000 parts by mass or less, a concentration necessary for forming the coating layer can be secured.

In the method for manufacturing the carbon-coated thermal conductive material according to one or more embodiments of the present invention, a step of adding a thermal conductive material composed of a metal oxide or a metal nitride to the aforementioned mixed solution and causing a reaction is performed. By causing the reaction to proceed, a layer composed of a naphthoxazine resin can be formed on the surface of the thermal conductive material.

The aforementioned reaction can proceeds at room temperature. However, heating to a temperature of 40° C. or higher may be performed, because then the reaction time can be shortened. In a case where heating is continued, the prepared oxazine ring is opened, and polymerization occurs. As a result, the molecular weight increases, and hence a so-called polynaphthoxazine resin is formed. In a case where the reaction proceeds excessively, viscosity of the solution increases and becomes inappropriate for coating. Accordingly, care is required.

Furthermore, for example, it is possible to use a method of adding a thermal conductive material after the mixed solution, which consists of formaldehyde, aliphatic amine, and dihydroxynaphthalene, is reacted for a certain period of time.

In order to make particles uniformly coated, the particles may be in a dispersed state at the time of coating reaction. As a dispersing method, a known method such as stirring, ultrasound, and rotation can be used. Furthermore, in order to improve the dispersed state, an appropriate dispersant may be added.

In addition, after the reaction step is performed, the solvent may be dried and removed by hot air or the like such that the surface of the thermal conductive material is uniformly coated with the resin. The heating and drying method is not particularly limited as well.

Then, in the method for manufacturing the carbon-coated thermal conductive material according to one or more embodiments of the present invention, a step of performing a thermal treatment at a temperature of 150° C. to 350° C. is performed.

Through this step, the resin used for coating in the preceding step is carbonized, and hence a coating layer composed of amorphous carbon can be obtained.

A method of the aforementioned thermal treatment is not particularly limited, and examples thereof include methods using a heating oven, an electric furnace, or the like.

A temperature during the thermal treatment is 150° C. to 350° C. In one or more embodiments of the present invention, a naphthoxazine resin that can be carbonized at a low temperature is used, and accordingly, amorphous carbon can be obtained at a lower temperature. In this case, an upper limit of the heating temperature may be 250° C.

The heating treatment may be performed in the air or in an inert gas such as nitrogen or argon. In a case where the temperature of the thermal treatment is 250° C. or higher, an inert gas atmosphere may be used.

The carbon-coated thermal conductive material according to one or more embodiments of the present invention can be used as a thermal conductive filler useful for improving a thermal conductivity, by adding a resin, rubber, grease, or the like to the carbon-coated thermal conductive material. Particularly, the carbon-coated thermal conductive material according to one or more embodiments of the present invention is useful for being used in a power device or the like that is required to have high thermal conductivity. Furthermore, the carbon-coated thermal conductive material according to one or more embodiments of the present invention is useful for being used for corrosion inhibition coating for metals, gas pipe lines, insulation of high heat-conductive metal materials, magnetic materials, and the like.

According to one or more embodiments of the present invention, it is possible to provide a carbon-coated thermal conductive material which can improve water resistance, oxidation resistance, and dispersibility at the time of being kneaded with a resin while maintaining excellent thermal conductive performance.

BRIEF DESCRIPTION OF DRAWINGS

The FIGURE is a transmission electron micrograph of a particle having undergone a surface coating treatment.

DESCRIPTION OF EMBODIMENTS

Hereinafter, one or more embodiments of the present invention will be more specifically described based on examples, but the present invention is not limited to the examples.

Example 1

(Formation of Coating Layer)

0.1 g of 1,5-dihydroxynaphthalene (manufactured by TOKYO CHEMICAL INDUSTRY CO., LTD.), 0.05 g of 40% methylamine (manufactured by Wako Pure Chemical Industries, Ltd.), and 0.1 g of a 37% aqueous formaldehyde solution (manufactured by Wako Pure Chemical Industries, Ltd.) were sequentially dissolved in ethanol, thereby preparing 20 g of a mixed ethanol solution.

Then, 0.2 g of thermal conductive particles (material: MgO, average particle size: 10 μm) were added to the obtained mixed solution, and the solution was treated for 4 hours in an ultrasonic tank. The solution was filtered, washed 3 times with ethanol, and then dried for 3 hours at 50° C. in a vacuum. The particles dried as above were heated for 2 hours at 150° C., thereby obtaining carbon-coated thermal conductive particles.

The surfaces of the thermal conductive particles having not yet been heated for 2 hours at 150° C. were measured by nuclear magnetic resonance spectroscopy (NMR spectroscopy). As a result, a peak (3.95 ppm) corresponding to a methylene group of "benzene ring-$CH_2$—N" of a naphthoxazine ring and a peak (4.92 ppm) corresponding to a methylene group of "O—$CH_2$—N" were detected at almost the same intensity. Therefore, it was confirmed that a resin component containing a naphthoxazine ring was precipitated on the surfaces of the particles.

The measurement by nuclear magnetic resonance spectroscopy was performed using $^1$H-NMR (600 MHz) manufactured by Varian Inova. At the time of the measurement, deuterated dimethyl sulfoxide was used, spectra were integrated 256 times, and a mitigation time was set to be 10 seconds.

The obtained carbon-coated thermal conductive particles were analyzed by Raman spectroscopy by using Almega XR (manufactured by Thermo Fisher Scientific Inc.). As a result, a peak was observed in both of a G band and a D band, and this leaded to a conclusion that the naphthoxazine resin turned into amorphous carbon.

A ratio of a peak intensity of the G band to a peak intensity of the D band was 1.7, and a 530 nm-laser beam was used.

Example 2

A carbon-coated thermal conductive particles were obtained in the same manner as in Example 1, except that in (Formation of coating layer) of Example 1, the step of heating dried particles for 2 hours at 150° C. was changed to a step of heating dried particles for 2 hours at 250° C.

Example 3

(Formation of Coating Layer)

0.5 g of 1,5-dihydroxynaphthalene (manufactured by TOKYO CHEMICAL INDUSTRY CO., LTD.), 0.25 g of 40% methylamine (Wako Pure Chemical Industries, Ltd.), and 0.6 g of a 37% aqueous formaldehyde solution (manufactured by Wako Pure Chemical Industries, Ltd.) were sequentially dissolved in ethanol, thereby preparing 20 g of a mixed ethanol solution.

Then, 0.2 g of thermal conductive particles (material: AlN, average particle size: 16 μm) were added to the obtained mixed solution, and the solution was treated for 4 hours in an ultrasonic rank. The solution was filtered, washed 3 times with ethanol, and dried for 3 hours at 50° C. in a vacuum. Furthermore, the particles dried as above were heated for 6 hours at 200° C., thereby obtaining carbon-coated thermal conductive particles.

Example 4

Carbon-coated thermal conductive particles were obtained in the same manner as in Example 3, except that in (Formation of coating layer) of Example 3, the step of heating dried particles for 6 hours at 200° C. was changed to a step of heating dried particles for 6 hours at 350° C.

Example 5

0.1 g of 1,5-dihydroxynaphthalene (manufactured by TOKYO CHEMICAL INDUSTRY CO., LTD.), 0.05 g of 40% methylamine (manufactured by Wako Pure Chemical Industries, Ltd.), and 0.1 g of a 37% aqueous formaldehyde solution (manufactured by Wako Pure Chemical Industries, Ltd.) were sequentially dissolved in ethanol, thereby preparing 20 g of a mixed ethanol solution.

Then, copper flakes (30 mm×15 mm×0.2 mm) were immersed into the obtained mixed solution, and the solution was treated for 4 hours in an ultrasonic tank. The solution was filtered, washed 3 times with ethanol, and dried for 2 hours at 80'C in a vacuum. The flakes dried as above were heated for 2 hours at 150° C., thereby obtaining carbon-coated metal flakes.

Comparative Example 1

The thermal conductive particles (material: MgO, average particle size: 10 μm) used in Example 1 were used as they were without being treated in "(Formation of coating layer)".

Comparative Example 2

The thermal conductive particles (material: AlN, average particle size: 16 μm) used in Example 3 were used as they were without being treated in "(Formation of coating layer)".

Comparative Example 3

The copper flakes (30 mm×15 mm×0.2 mm) used in Example 5 were used as they were without being treated in "(Formation of coating layer)".

Comparative Example 4

As a solvent, 4.8 g of dimethyl sulfoxide-$d_6$ (manufactured by Wako Pure Chemical Industries, Ltd.) was put into a 50 ml beaker. Then, as raw materials, 0.16 g of 1,5-dihydroxynaphthalene, 0.08 g of a 40% aqueous methylamine solution, and 0.16 g of a 37% aqueous formaldehyde solution were added thereto in this order. The raw materials were dissolved by being gently stirred with a glass bar, thereby preparing a mixed solution.

The mixed solution was left to stand for 5 hours at room temperature, and 0.2 g of AlN (average particle size: 16 μm) as thermal conductive particles was added to the solution. The particles separated through filtration were heated for 3 hours at 120° C. and then subjected to a thermal treatment for 3 hours at 250° C., thereby obtaining carbon-coated AlN particles.

Comparative Example 5

In 50 ml of water, 0.5 g of AlN particles (average particle size: 16 μm) and 3.0 g of glucose were dispersed by stirring. Then, the mixed solution was moved to a pressure-resistant container made of stainless steel including a Teflon (registered trademark) inner cylinder and subjected to a thermal treatment for 12 hours at 180° C. After the reaction, the mixed solution was cooled to room temperature and went through a step of centrifugation and washing, thereby obtaining carbon-coated AlN particles.

(Evaluation Method)

(1) Measurement of Film Thickness of Coating Layer (Average Film Thickness and CV Value)

An average film thickness and a CV value of the coating layer were evaluated using a transmission microscope (FE-TEM).

Specifically, for 20 random particles, sectional images of coating layers were captured using FE-TEM. Then, from the obtained sectional images, a film thickness was randomly measured at 10 different sites of each particle, and an average film thickness and a standard deviation were calculated. From the obtained numerical values, a coefficient of variation of the film thickness was calculated.

There is a big difference in an atomic weight between carbon, with which the particle surface is coated, and the thermal conductive particles of the core. Therefore, from a contrast difference of the TEM image, a film thickness of the coating layer (carbon layer) can be estimated.

(2) Average Particle Size

By using X-ray diffractometry (device: LA-950, manufactured by HORIBA, Ltd.), an average particle size of the obtained particles was measured.

(3) TOF-SIMS Measurement

For the coating layer of the obtained particles, by using a TOF-SIMS 5-type device (manufactured by ION-TOF GmbH), a mass spectrum (at around 77.12) resulting from a benzene ring and a mass spectrum (at around 127.27) resulting from a naphthalene ring were confirmed by Time-of-Flight Secondary Ion Mass Spectrometry (TOF-SIMS). The TOF-SIMS measurement was performed under the following conditions. Furthermore, in order to avoid contamination resulting from contaminants in the air or from the storage case as much as possible, the prepared sample was stored in a clean case for storing a silicon wafer.

Primary ion: 209Bi+1
Ion voltage: 25 kV
Ion current: 1 pA
Mass range: 1 to 300 mass
Analysis area: 500×500 μm
Prevention of charging: neutralization by electron irradiation
Random raster scan (4) X-Ray Diffraction By using an X-ray diffractometer (SmartLab Multipurpose, manufactured by Rigaku Corporation), diffraction data was obtained under the following measurement conditions. X-ray wavelength: CuKα 1.54 A, measurement range: 2θ=10° to 70°, scan rate: 4°/min, step: 0.02°

Regarding the obtained diffraction data, whether or not a peak is detected at a position of 2θ=26.4° was confirmed.

Furthermore, from the obtained diffraction data, a half-width was calculated and plugged into the Scherrer equation, thereby determining a crystallite size. Specifically, an average crystallite diameter calculated from a half-width at the time when 2θ=27.86 was adopted. Furthermore, an average crystallite diameter obtained after the particles were fired for 2 hours at 800° C. was also measured.

A series of analyses described above was performed using analysis software (PDXL 2).

(5) Evaluation of Water Resistance (5-1) MgO-Containing Particles 1 g of the particles obtained in Examples 1 and 2 and Comparative Example 1 were spread onto the bottom of a glass container and tested by being left to stand for 1 week (168 hours) in a thermohygrostat with a temperature of 85° C. and a relative humidity of 85%. A rate of weight change before and after the test was calculated using the following equation, and then water absorbing properties of the particles were evaluated based on the following criteria.

Rate of weight change (% by weight)=(weight after being left to stand−initial weight)×100

O (Excellent): a rate of weight change is less than 1.0% by weight
X (Poor): a rate of weight change is 1.0% by weight or greater (5-2) AlN-Containing Particles 1.0 g of the particles obtained in Examples 3 and 4 and Comparative Examples 2, 4, and 5 were left to stand for 72 hours in an airtight container at 121° C. and 2 atm, which are conditions for a pressure cooker test (PCT), and an oxygen content in the particles before and after being left to stand was measured. From the measured result, an increase of oxygen was calculated using the following equation and evaluated based on the following criteria. The pressure cooker test (PCT) is a testing method authorized as a method for evaluating moisture resistance of electronic parts.

Increase of oxygen=oxygen amount in particles after PCT treatment/oxygen amount in particles before PCT treatment O (Excellent): an increase of oxygen is less than 1.2%
X (Poor): an increase of oxygen is 1.2% or greater (5) Oxidation Resistance The flakes obtained in Example 5 and Comparative Example 3 were heated for 3 hours at 200° C. in the air.

Through XPS, an increase of oxygen before and after heating was measured, and then oxidation resistance was evaluated based on the following criteria.

O: A color change was not visually recognized before and after heating, or an increase of oxygen before and after heating is less than 10%

X: A color change was visually recognized before and after heating, or an increase of oxygen before and after heating is 10% or greater (6) Dispersibility 650 parts by weight of the particles obtained in examples and comparative examples were added to 350 parts by weight of an epoxy resin, and the particles were dispersed in the resin by using Rentaro (1,500 rpm, for 2 minutes). The viscosity of the obtained dispersed material was measured immediately after dispersion. Furthermore, the viscosity of a liquid of an upper layer formed after the dispersed material was left to stand for 3 hours was measured. Then, by using the following equation, a rate of decrease of viscosity was calculated. By using the obtained rate of decrease of viscosity, dispersibility was evaluated based on the following criteria.

Rate of decrease of viscosity (%)=((viscosity immediately after dispersion−viscosity after being left to stand for 3 hours)/viscosity immediately after dispersion)×100

O: a rate of decrease of viscosity is less than 5%
Δ: a rate of decrease of viscosity is 5% to 10%
X: a rate of decrease of viscosity is greater than 10%

(7) Measurement of Rate of Change of Thermal Conductivity

The particles obtained in examples and comparative examples and imide-modified epoxy resin powder were thoroughly mixed together by a ball mill, thereby preparing a resin composition (a content of the thermal conductive particles with respect to a total content of the resin and the thermal conductive particles: 80% by weight)

Then, by using a heated pressing machine, the obtained resin composition was heated for 25 minutes at 180° C., thereby obtaining a molded material having a diameter of 10 mm and a height of 2 mm. The molded material was then cured by being subjected to a heating treatment for 2 hours at 200° C.

The obtained cured molded material was subjected to a PCT test for 72 hours. Thermal conductivities of the cured molded articles before and after the test were measured by a laser flash method and compared with each other.

Rate of change of thermal conductivity (%)=((thermal conductivity before PCT test−thermal conductivity after PCT test)/thermal conductivity before PCT test)×100

TABLE 1

| | Thermal conductive material | | Coating Layer | | | | | Evaluation | | | | | | | |
|---|---|---|---|---|---|---|---|---|---|---|---|---|---|---|---|
| | | | | | | TOF-SIMS measurement | | | Water resistance (MgO) | | Water resistace (AlN) | | Oxidation resistance (copper) | | Rate of change of thermal |
| | Material | Thermal conductivity (W/mk) | Average film thickness (nm) | CV value of film thickness (%) | Ratio of peak intensity | Benzene ring | Naphthal ring | X-ray diffraction | Rate of weight change (%) | Determination | Increase of oxygen (%) | Determination | Increase of oxygen (%) | Determination | Dispersibility | conductivity (%) |
| Example 1 | MgO | 50 | 30 | 4 | 1.7 | Present | Present | No peak | 0.8 | ○ | — | — | — | — | ○ | 5.2 |
| Example 2 | MgO | 50 | 30 | 4 | 2.5 | Present | Present | No peak | 0.5 | ○ | — | — | — | — | ○ | 4.8 |
| Example 3 | AlN | 170 | 450 | 13 | 3.3 | Present | Present | No peak | — | — | 10 | ○ | — | — | ○ | 3.1 |
| Example 4 | AlN | 170 | 450 | 13 | 4.1 | Present | Present | No peak | — | — | 6 | ○ | — | — | ○ | 2.8 |
| Example 5 | Copper | 390 | 110 | 8 | 1.5 | Present | Present | No peak | — | — | — | — | 5 | ○ | — | 8.5 |
| Comparative Example 1 | MgO | 50 | — | — | — | Absent | Absent | No peak | 25 | X | — | — | — | — | X | 90 |
| Comparative Example 2 | AlN | 170 | — | — | — | Absent | Absent | No peak | — | — | 40 | X | — | — | X | 96 |
| Comparative Example 3 | Copper | 390 | — | — | — | Absent | Absent | No peak | — | — | — | — | 30 | X | — | 80 |
| Comparative Example 4 | AlN | 170 | 550 | 30 | 1.5 | Present | Present | No peak | — | — | 20 | X | — | — | ○ | 40 |
| Comparative Example 5 | AlN | 170 | 300 | 18 | 0.8 | Absent | Absent | No peak | — | — | 25 | X | — | — | △ | 30 |

According to one or more embodiments of the present invention, it is possible to provide a carbon-coated thermal conductive material which can improve water resistance while maintaining excellent thermal conductive performance.

Furthermore, according to one or more embodiments of the present invention, it is possible to provide a method for manufacturing the carbon-coated thermal conductive material.

Although embodiments of the disclosure have been described using specific terms, devices, and methods, such description is for illustrative purposes only. The words used are words of description rather than limitation. It is to be understood that changes and variations may be made by those of ordinary skill in the art without departing from the spirit or the scope of the present disclosure, which is set forth in the following claims. In addition, it should be understood that aspects of the various embodiments may be interchanged in whole or in part. Therefore, the spirit and scope of the appended claims should not be limited to the description of the preferred versions contained therein.

The invention claimed is:

1. A carbon-coated thermal conductive material comprising:
   a thermal conductive material having a particle shape; and
   a coating layer comprising amorphous carbon on a surface of the thermal conductive material, wherein
   the thermal conductive material comprises at least one selected from the group consisting of
   a metal oxide, a metal nitride, a metal material, and a carbon-based material having a thermal conductivity of 10 W/mK or greater,
   the amorphous carbon is derived from carbon contained in an oxazine resin,
   a ratio of a peak intensity of a G band to a peak intensity of a D band is 1.0 or greater when the amorphous carbon is measured by Raman spectroscopy,
   an average film thickness of the coating layer is 500 nm or less, and
   a coefficient of variation (CV value) of a film thickness of the coating layer is 15% or less.

2. The carbon-coated thermal conductive material according to claim 1, wherein
   at least one of a mass spectrum resulting from a benzene ring and a mass spectrum resulting from a naphthalene ring is detected when the coating layer is measured by time-of-flight secondary ion mass spectrometry (TOF-SIMS).

3. The carbon-coated thermal conductive material according to claim 1, wherein
   no peak is detected at a position in which 2θ equals 26.4° when the coating layer is measured by X-ray diffractometry.

4. The carbon-coated thermal conductive material according to claim 1, wherein
the oxazine resin is a naphthoxazine resin.

5. The carbon-coated thermal conductive material according to claim 2, wherein
the oxazine resin is a naphthoxazine resin.

6. The carbon-coated thermal conductive material according to claim 1,
wherein the thermal conductive material comprises the metal oxide or the metal nitride,
wherein the metal oxide is magnesium oxide (MgO), and
wherein the metal nitride is aluminum nitride (AlN).

7. The carbon-coated thermal conductive material according to claim 2,
wherein the thermal conductive material comprises the metal oxide or the metal nitride,
wherein the metal oxide is magnesium oxide (MgO), and
wherein the metal nitride is aluminum nitride (AlN).

8. The carbon-coated thermal conductive material according to claim 3,
wherein the thermal conductive material comprises the metal oxide or the metal nitride,
wherein the metal oxide is magnesium oxide (MgO), and
wherein the metal nitride is aluminum nitride (AlN).

9. The carbon-coated thermal conductive material according to claim 4,
wherein the thermal conductive material comprises the metal oxide or the metal nitride,
wherein the metal oxide is magnesium oxide (MgO), and
wherein the metal nitride is aluminum nitride (AlN).

10. The carbon-coated thermal conductive material according to claim 5,
wherein the thermal conductive material comprises the metal oxide or the metal nitride,
wherein the metal oxide is magnesium oxide (MgO), and
wherein the metal nitride is aluminum nitride (AlN).

11. The carbon-coated thermal conductive material according to claim 1,
wherein the thermal conductive material comprises the metal material, and
wherein the metal material is at least one selected from the group consisting of copper (Cu), nickel (Ni), iron (Fe), and cobalt (Co).

12. The carbon-coated thermal conductive material according to claim 2,
wherein the thermal conductive material comprises the metal material, and
wherein the metal material is at least one selected from the group consisting of copper (Cu), nickel (Ni), iron (Fe), and cobalt (Co).

13. The carbon-coated thermal conductive material according to claim 3,
wherein the thermal conductive material comprises the metal material, and
wherein the metal material is at least one selected from the group consisting of copper (Cu), nickel (Ni), iron (Fe), and cobalt (Co).

14. The carbon-coated thermal conductive material according to claim 4,
wherein the thermal conductive material comprises the metal material, and
wherein the metal material is at least one selected from the group consisting of copper (Cu), nickel (Ni), iron (Fe), and cobalt (Co).

15. The carbon-coated thermal conductive material according to claim 5,
wherein the thermal conductive material comprises the metal material, and
wherein the metal material is at least one selected from the group consisting of copper (Cu), nickel (Ni), iron (Fe), and cobalt (Co).

* * * * *